(12) United States Patent
Tao

(10) Patent No.: US 6,977,131 B2
(45) Date of Patent: Dec. 20, 2005

(54) SELECTED POLYMERIC SULFONATE ACID GENERATORS AND THEIR USE IN PROCESSES FOR IMAGING RADIATION-SENSITIVE ELEMENTS

(75) Inventor: Ting Tao, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 105 days.

(21) Appl. No.: 10/159,891

(22) Filed: May 30, 2002

(65) Prior Publication Data

US 2003/0224284 A1 Dec. 4, 2003

(51) Int. Cl.$^7$ ............................................. G03F 7/004
(52) U.S. Cl. ................... 430/270.1; 430/325; 430/914; 430/917; 430/927; 532/31; 532/32
(58) Field of Search .............................. 430/270.1, 325, 430/914, 921, 927; 532/31, 32

(56) References Cited

U.S. PATENT DOCUMENTS

| | | | |
|---|---|---|---|
| 4,661,429 A | | 4/1987 | Molaire et al. |
| 4,708,925 A | | 11/1987 | Newman |
| 5,372,907 A | | 12/1994 | Haley et al. |
| 5,658,706 A | * | 8/1997 | Niki et al. ............... 430/270.1 |
| 5,691,101 A | * | 11/1997 | Ushirogouchi et al. ..... 430/176 |
| 5,744,281 A | * | 4/1998 | Niki et al. ............... 430/270.1 |
| 5,763,134 A | | 6/1998 | Busman et al. |
| 5,919,601 A | | 7/1999 | Nguyen et al. |
| 5,945,250 A | | 8/1999 | Aoai et al. |
| 5,965,319 A | * | 10/1999 | Kobayashi ................. 430/176 |
| 6,042,987 A | | 3/2000 | Kobayashi |

FOREIGN PATENT DOCUMENTS

| | | | | |
|---|---|---|---|---|
| EP | 632003 | * | 1/1995 | ........... G03F/7/022 |
| EP | 1120245 | * | 8/2001 | ............ B41C/1/00 |
| EP | 1203659 A2 | | 5/2002 | |
| JP | 10-193554 | * | 7/1998 | ............ G03F/7/00 |
| JP | 10221852 | | 8/1998 | |
| JP | 2000-112136 | * | 4/2000 | ............ G03F/7/11 |
| WO | WO 00/17711 | | 3/2000 | |

OTHER PUBLICATIONS

English language machine translation of JP 10–193554.*
English language machine translation of JP 2000–112136.*
Interaction of a diazoresin with sodium dodecyl sulfate in aqueous solution by Hao Luo, Boxuan Yang, Lei Yang and Weiixiao Cao, College of Chemistry and Molecular Engineering. Received Jan. 26, 1998; revised Feb. 16, 1998. Macromol. Rapid Commun. 19, 291–294 (1998).

* cited by examiner

*Primary Examiner*—Amanda Walke
(74) *Attorney, Agent, or Firm*—Ratner Prestia

(57) ABSTRACT

A radiation-sensitive patterning composition comprising:
(1) at least one acid generating compound selected from the group of compounds of formulae (I) or (II):

(I)

(II)

wherein $R_1$, $R_2$, $R_3$, $R_4$, $R_5$, and $R_6$, are individually selected from the group consisting of a hydrogen atom, nitro group, hydroxyl group, a carbonyl group, a halogen atom, a cyano group and an unsubstituted or substituted alkyl group, an unsubstituted or substituted cycloalkyl group; an unsubstituted or substituted alkoxy group, or an unsubstituted or substituted aryl group;

wherein $X^+$ represents an onium ion selected from the group consisting of diazonium, iodonium, sulfonium, phosphonium, bromonium, chloronium, oxysulfoxonium, oxysulfonium, sulfoxonium, selenium, tellurium and arsenium; and wherein n is an integer from 4 to 100;

(2) at least one cross-linking agent cross-linkable by an acid;

(3) at least one polymer compound capable of reacting with the cross-linking agent; and (4) at least one infrared absorbing compound.

32 Claims, No Drawings

1

SELECTED POLYMERIC SULFONATE ACID GENERATORS AND THEIR USE IN PROCESSES FOR IMAGING RADIATION-SENSITIVE ELEMENTS

BACKGROUND OF THE INVENTION

1. Field of the Invention

This invention relates to selected acid generating agents useful in radiation-sensitive patterning compositions. The invention relates to such radiation-sensitive patterning compositions as well as methods of imaging radiation-sensitive elements containing such radiation-sensitive patterning compositions.

2. Brief Description of Art

Thermally sensitive, negative working printing plates are generally made with radiation-sensitive patterning compositions that are imaged on a substrate. These patterning compositions commonly contain radiation-sensitive material that is a mixture of an acid generator, a cross-linking resin or compound, a binder resin and an infrared (IR) absorber. Many of the acid generators previously employed in these patterning compositions either contain ozone depletion elements such as fluorine or contain heavy metal such as antimony (Sb) or arsenic (As), which may cause serious environmental contamination problems. Also, some of these previously used acid generators produce volatile acids (e.g., HF, HCl, HBr, HI) that can be easily volatized and lost under conditions of thermal imaging and subsequent optional baking, thereby reducing the cure rate. Such volatile acid loss decreases the efficiency of the printing plates.

Examples of these prior art acid generators are reported in the following:

U.S. Pat. No. 4,708,925 (Newman) describes a photo-solubilizable composition comprising an alkali-soluble phenolic resin and an onium salt. The onium salt imparts a solvent resistance to the phenolic resin that is removed upon exposure to radiation thereby providing a solubility differential between exposed and unexposed areas of the composition. Suitable iodonium salts include iodonium, sulphonium, bromonium, chloronium, oxysulphonium, sulphoxonium, selenium, telluronium, phosphonium and arsenium salts. Preferably the acid from which the anion is derived has a pKa<5. Suitable inorganic anions include halide anions, bisulfate, tetrafluoroborate, hexafluorophosphate, hexafluoroarsenate and hexafluoroantimonate. Suitable organic anions include those of the formulae: $R^1COO^-$ and $R^1SO_3^-$, in which $R^1$ is an alkyl or aryl. Again, this reference does not teach or suggest the particular acid generators of the present invention.

U.S. Pat. No. 5,372,907 (Haley et al.) describes a radiation-sensitive patterning composition comprising a mixture of (1) a resole, (2) a novolak resin, (3) a latent Bronsted acid (i.e., acid generating agent) and (4) an infrared absorber. In the specification, the latent Bronsted acids in the invention include onium salts, in particular iodonium, sulfonium, phosphonium, selenium, diazonium and arsenium, with anions such as hexafluorophosphate, hexafluoroantimonate and trifluoromethane sulfonate. However, this reference does not disclose or suggest any latent Bronsted acids of the present invention.

U.S. Pat. No. 5,919,601 (Nguyen et al.) describes a printing plate composition comprising a thermal-activated acid generator; a cross-linking resin; a binder resin comprising a polymer containing reactive pendant groups selected from hydroxyl, carboxylic acid, sulfonamide, and alkoxymethylamide; and an infrared absorber. The composition claims that acid generator is selected from halo alkyl substituted S-triazines and salts containing an onium cation and non-nucleophilic anion, wherein the onium cation is selected from iodonium, sulphonium, phosphonium, oxysulphoxonium, oxysulphonium, sulphoxonium, ammonium and diazonium; the non-nucleophilic anion is selected from tetrafluoroborate, hexafluorophosphate, hexafluoroantimonate, hexafluoroarsenate, triflate, tetrakis(penta-flurophenyl)borate, pentafluoroethyl sulfonate, p-methylbenzenesulfonate, ethyl sulfonate, trifluoromethylacetate and pentafluoroethyl acetate. This reference does not disclose or suggest the acid generators of the present invention.

U.S. Pat. No. 5,945,250 (Aoai et al.) teaches a positive-type photosensitive composition that contains a polymeric sulfonate resin of an iodonium or sulfonium salt and which generates a sulfonic acid upon receiving light. This light-exposed resin increases in solubility in an alkali developer to provide a positive resist pattern.

U.S. Pat. No. 5,965,319 (Kobayashi) describes certain onium salt compounds having sulfonic acid as the counter ion to generate sulfonic acid decomposed by light or heat. These onium salts include diazonium sulfonates represented by the following structural formula:

$$Ar^1-N_2^+R^1-SO_3^-$$

wherein $R^1$ represents a hydrocarbon group having 20 or fewer carbon atoms which may be substituted; and $Ar^1$ represents an aryl group having 20 or fewer carbon atoms which may be substituted. This reference does not teach or suggest any of the acid generators of the present invention.

U.S. Pat. No. 6,042,987 (Kobayashi) describes a photo-sensitive negative image recording material for printing plate having a image recording layer containing a compound which is degraded by the action of light or heat to generate an acid, including an onium salt having a halide, $ClO_4^-$, $PF_6^-$, $BF_4^-$ or sulfonate as a counter ion. There is no knowledge of using the compounds with formulae (I)–(III) in the invention.

WO 00/17711 (IBF Industria Brasileira De Filmes S/A) describes a composition comprising a dual polymer system, an infrared absorbing material, an acid generating compound, and an acid stabilizing compound. The acid generating compounds named therein include, as anions, chloride, bisulfate, hexafluoroantimonate, hexafluorophosphate, tetrafluoroborate, methane sulfonate and mesitylene sulfonate. However, this reference does not teach or suggest acid generating compounds in the present invention.

Accordingly, there is a need for better acid generators that can be used in radiation-sensitive patterning compositions that do not contain environmental questionable elements or produce undesirable volatile acids, yet have a high photolysis efficiency and good photo sensitivity. The present invention provides a solution to that need. In particular, the present invention provides an improved cure rate, processing latitude, processing robustness and long shelf life while maintaining moderate energy requirements of the acid generation step.

BRIEF SUMMARY OF THE INVENTION

Therefore one aspect of the present invention is directed to a radiation-sensitive patterning composition comprising:

(1) at least one acid generating compound selected from the group of compounds of formulae (I) or (II):

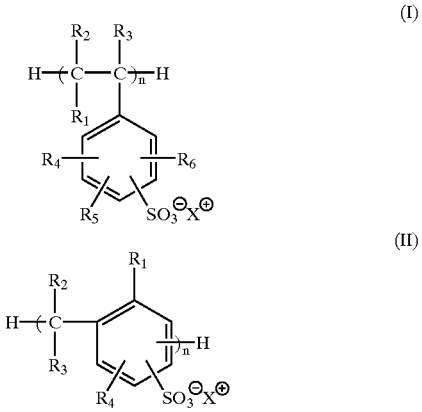

wherein $R_1$, $R_2$, $R_3$, $R_4$, $R_5$, and $R_6$, are individually selected from the group consisting of a hydrogen atom, a nitro group, a hydroxy group, a carboxyl group, a halogen atom, a cyano group, an unsubstituted or unsubstituted alkyl group, an unsubstituted or substituted cycloalkyl group; an unsubstituted or substituted alkoxy group, or an unsubstituted or substituted aryl group; wherein $X^+$ represents an onium ion selected from the group consisting of diazonium, iodonium, sulfonium, phosphonium, bromonium, chloronium, oxysulfoxonium, oxysulfonium, sulfoxonium, selenium, tellurium or arsenium; and wherein n is from 4 to 100;

(2) at least one cross-linking agent cross-linkable by an acid;

(3) at least one polymer compound capable of reacting with the cross-linking agent; and (4) at least one infrared absorbing compound Another aspect of the present invention is directed to a radiation-sensitive imaging element comprising a lithographic substrate having a coating of the above-noted radiation-sensitive composition thereon.

Yet another aspect of the present invention is directed to a process of imaging a radiation-sensitive element comprising the steps of:

(1) providing a photosensitive imaging element comprising a lithographic substrate having a layer of the above-noted photosensitive composition thereon;

(2) imagewise exposing the radiation-sensitive imaging element;

(3) removing unexposed areas of the photosensitive composition layer from the lithographic substrate, leaving a negative-working imaging element.

Optionally, the imaged radiation-sensitive imaging element may be baked after step (2) and before step (3) at a temperature and time period sufficient to produce a cured element.

One of the advantages of the present invention is that the present acid generators do not contain either ozone depletion elements such as fluorine or heavy metals such as antimony (Sb) or arsenic (As), which may cause environmental contamination problems if improperly used. Another advantage of the present invention is that the present generated acids are non-volatile at elevated operating temperatures, thus the loss of acid by evaporation is minimized. Still further, the photosensitive compositions of the present invention provide excellent photographic sensitivity and photolysis efficiency. In particular, the present invention allows for improved curing rate, processing latitude and robustness of thermal preheated negative working patterning compositions especially printing plates, while maintaining adequate shelf life.

The present radiation-sensitive composition can be used in various types of lithography including photomask lithography, imprint lithography, microelectronic and microoptical devices, printed circuit boards and especially radiation-sensitive lithographic plates.

DETAILED DESCRIPTION OF THE INVENTION

I. Radiation-Sensitive Patterning Compositions

As stated above, the radiation-sensitive patterning compositions comprise a mixture of at least four components plus optionally other compounds. These ingredients are preferably as follows:

(A) Acid Generating Compounds

Examples of the alkyl groups represented by $R_1$ to $R_6$ in formulae (1) and (II) include an alkyl group having 1 to 20 carbon atoms (e.g. methyl group, ethyl group, n-propyl group, isopropyl group, allyl group, n-butyl group, sec-butyl group, t-butyl group, hexyl group, cyclohexyl group, octyl group, 2-ethylhexyl group, and dodecyl group) that may be unsubstituted or substituted.

Examples of the cycloalkyl groups represented by $R_1$ to $R_6$ in formulae (I) and (II) include cycloalkyl groups having 3 to 8 carbon atoms (e.g. cyclopropyl, cyclopentyl, and cyclohexyl) that may be unsubstituted or substituted.

Examples of the alkoxy groups represented by $R_1$ to $R_6$ in formulae (I) and (II) include these having 1 to 8 carbon atoms (e.g. methoxy, ethoxy, hydroxyethoxy, propoxy, n-butoxy, isobutoxy, sec-butoxy, t-butoxy, hexyloxy, and octyloxy) that may be unsubstituted or substituted.

Examples of aryl groups represented by $R_1$ to $R_6$ in formula (I) or (II) include those having 6 to 14 carbon atoms (e.g. phenyl, tolyl, methoxyphenyl and naphthyl), that may be unsubstituted or substituted.

Examples of the halogen atom include fluorine, chlorine, bromine and iodine.

The substituents on these alkyl groups, cycloalkyl groups, alkoxy groups and aryl groups include a halogen atom, hydroxy group, alkoxy group, aryloxy group, nitro group, cyano group, carbonyl group, carboxyl group, alkoxycarbonyl group, anilino group, and acetamido group.

The preferred cationic portion of the onium salts represented by $X^+$ in the general formulas (I) and (II), include an iodonium ion, sulfonium ion, and diazonium ion, most preferably, 2-methoxy-4-(phenylamino)-benzenediazonium.

$R_1$ to $R_6$ are preferably hydrogen, hydroxyl and unsubstituted alkyl groups having 1 to 20 carbon atoms.

Preferably, n is an integer from 4 to 20.

One preferred polymeric sulfonate acid generating compound is represented by formula (I) wherein $R_1$, $R_2$, $R_3$, $R_4$, $R_5$, and $R_6$, are all hydrogen, the $SO_3^{31}$ groups are in the para-positions to the ($-CH-CH_2-$) repeating group, n is about 8, and $X^+$ is 2-methoxy-4-(phenylamino)-benzenediazonium. This compound is known as 2-methoxy- 4-(phenylamino)-benzenediazonium polystyrene sulfonate (MSPSS), and its synthesis is shown in Example 1 below.

Another preferred polymeric sulfonate acid generating compound is represented by formula (II) wherein $R_1$ is a hydroxyl group; n is from about 4 to 20, and $X^{30}$ is 2-methoxy-4-(phenylamino) benzene diazonium. This compound is known as 2-methoxy-4-(phenylamino)-benzene diazonium sulfonated phenolic resin (MSFC-369), and its synthesis is shown in Example 2 below.

The preferred novolak resin precursor for this second embodiment is FC-369 available from 3M Corporation of St. Paul, Minn. The exact identification of $R_2$, $R_3$, and $R_4$ and n are not disclosed by 3M, but it is believed the $SO_3^-$ group is in both the para and meta position to the hydroxyl group (i.e., there are a mixture of these two isomers).

Onium salt sulfonates preferably used in the present invention can be obtained by reaction of the corresponding onium chloride, bromide, fluoride, iodide or bisulfate salt with sodium or potassium polymeric sulfonate in water or solvent mixture of water and an organic solvent such as an alcohol.

These compounds are added to radiation-sensitive patterning compositions of the present invention in an amount of 0.01 to 50% by weight, preferably 0.1 to 25% by weight, and more preferably 0.5 to 20% by weight based on the total solid components of the patterning composition. In a case in which the amount added is less than 0.01% by weight, an image cannot be obtained, and, in a case in which the amount added is more than 50% by weight, a stain is produced in a nonimage formation portion at the time of printing, and thus neither is preferable.

(B) Cross-Linking Agents Cross-Linkable by an Acid

Cross-linking agents cross-linkable by an acid preferably used in the present invention (hereinafter referred to as a cross-linking agent) are compounds having, in a molecule, at least two groups bonded to a benzene ring, such as a hydroxymethyl group, alkoxymethyl group, epoxy group, and vinyl ether group. Examples thereof include methylol melamine, resol resin, epoxidized novolak resin, and urea resin. Other examples include amino resins having at least 2 alkoxymethyl groups (e.g. alkoxymethylated melamine resin, alkoxymethylated glycoluril and alkoxymethylated benzoguanamine). Furthermore, compounds disclosed in "Kakyozai Handbook (Cross-linking Agent Handbook)", by Shinzo Yamashita and Tosuke Kaneko, published by Taiseisha, Co., Ltd., are also preferable. In particular, phenol derivatives having, in a molecule, at least two groups bonded to a benzene ring such as a hydroxymethyl group and alkoxymethyl group provide good fastness in an image portion when an image is formed, and thus are preferable. Examples of phenol derivatives include resol resin. Preferred resole resins would be GP649D99 resole available from Georgia Pacific and BKS-5928 resole resin available from Union Carbide Corporation.

However, these cross-linking agents are unstable with respect to heat, and thus they are not very favorable in terms of storability after the production of an image recording material. On the other hand, phenol derivatives having, in a molecule, at least two groups bonded to a benzene ring such as a hydroxymethyl group and alkoxymethyl group, and 3 to 5 benzene rings with a molecular weight of 1,200 or less have good storability, and thus are most preferably used in the present invention.

As an alkoxymethyl group, those having 6 or fewer carbon atoms are preferable. Examples thereof include a methoxymethyl group, ethoxymethyl group, n-propoxymethyl group, isopropoxymethyl group, n-butoxymethyl group, isobutoxymethyl group, sec-butoxymethyl group, and t-butoxymethyl group. Furthermore, alkoxy groups having an alkoxy substituent or alkoxy substituents such as a 2-methoxyethoxy group, and 2-methoxy-1-propyl group are also preferable.

Among these phenol derivatives, particularly preferable ones are illustrated in U.S. Pat. No. 5,965,319 (columns 31–38).

Phenol derivatives having a hydroxymethyl group can be obtained by the reaction of a corresponding phenol compound without a hydroxymethyl group and formaldehyde in the presence of a base catalyst. At the time, it is preferable that a reaction temperature be 60° C. or less so as to prevent resinification or gelation of the phenol derivative. Specifically, the phenol derivatives having a hydroxymethyl group can be synthesized by methods disclosed in Japanese Patent Application Laid-Open (JP-A) Nos. 6-282067 and 7-64285.

Phenol derivatives having an alkoxymethyl group can be obtained by the reaction of a corresponding phenol derivative having a hydroxymethyl group and alcohol in the presence of an acid catalyst. At the time, it is preferable that a reaction temperature be 100° C. or less so as to prevent resinification or gelation of the phenol derivative. Specifically, the phenol derivatives having an alkoxymethyl can be synthesized by a method disclosed in European Patent (EP) No. 632,003A1.

The phenol derivatives having a hydroxymethyl group or an alkoxymethyl group synthesized as mentioned above are preferable in terms of storability. The phenol derivatives having an alkoxymethyl group are particularly preferably in terms of storability.

One particularly preferred cross-linking agent is terephthaldicarboxyaldehyde.

In the present invention, a cross-linking agent is used in the amount of 5 to 70% by weight, and preferably 10 to 65% by weight based on the total solids of the radiation-sensitive material. In a case in which the amount of the cross-linking agent is less than 5% by weight, the film strength of the image portion at the time of image recording deteriorates. On the other hand, an amount more than 70% by weight is not preferable in terms of storability.

These cross-linking agents can be used alone or in a combination of two or more.

(C) Polymer Compounds Capable of Reacting with said Cross-Linking Agent

Any polymer capable of reacting with the cross-linking agent to prepare suitable radiation-sensitive compositions may be employed in the present invention. One preferred class of these polymers are polymer compounds having an alkaline-soluble group in the molecule. These polymer compounds having an alkaline-soluble group used in the present invention (hereinafter referred to as alkaline-soluble polymer compound) mean resins having an alkaline-soluble group in a molecule, such as a novolak resin, acetone-pyrogallol resin, polyhydroxystyrenes, hydroxystyrene-N-substituted maleimide copolymer, hydroxystyrene-maleic anhydride copolymer, and polymer compound such as an acrylic copolymer or a urethane type polymer having an alkaline-soluble group, whose monomers include 1 mol % or more of a component unit having an acidic group such as an acrylic acid. Examples of an alkaline-soluble group here include a carboxyl group, phenolic hydroxyl group, sulfonic acid group, phosphonic acid group, imide group, carbonate groups and sulfonamide groups.

Novolak resins are resins obtained by the condensation of phenols and aldehydes under an acidic condition. Examples of preferable novolak resins include novolak resin obtained from phenol and formaldehyde, novolak resin obtained from m-cresol and formaldehyde, novolak resin obtained from o-cresol and formaldehyde, novolak resin obtained from octylphenol and formaldehyde, novolak resin obtained from m-/p-mixed cresol and formaldehyde, novolak resin obtained from a mixture of phenol/cresol (either of m-, p-, o-, or m-/p-, m-/o-, o-/p-mixed) and formaldehyde, novolak resin obtained from resorcinol and formaldehyde, and novolak resin obtained from phenol/resorcinol and formaldehyde. It is preferable that these novolak resins have a weight-average molecular weight of 800 to 200,000 and a number-average molecular weight of 400 to 60,000.

In a case in which a polymer, at least one of whose monomers is hydroxystyrene such as poly-p-hydroxystyrene, poly-m-hydroxystyrene, p-hydroxystyrene-N-substituted maleimide copolymer, and p-hydroxystyrene-maleic anhydride copolymer is used, it is preferable that the weight-average molecular weight be 2,000 to 500,000, and preferably 4,000 to 300,000.

Examples of acrylic copolymers having an alkaline-soluble group include methacrylic acid-allylmethacrylate copolymer, methacrylic acid-benzylmethacrylate copolymer, methacrylic acid-hydroxyethylmethacrylate copolymer, poly(hydroxyphenyl methacrylamide), poly (hydroxyphenylcarbonyloxyethyl acrylate), and poly(2,4-dihydroxyphenyl carbonyloxyethyl acrylate). These acrylic resins are resins whose monomers include a component unit having, in a molecule, an acidic group such as carboxyl group and hydroxyphenyl group. Resins whose component units include 1 mol % or more of (meth)acrylic acid, hydroxystyrene, and hydroxyphenyl (meth)acrylamide based on the total component units and whose weight-average molecular weight is 2,000 to 500,000, preferably 4,000 to 300,000 is preferable.

Examples of urethane type polymers having an alkaline-soluble group include a resin obtained by the reaction of diphenylmethane diisocyanate, hexamethylene diisocyanate, tetraethylene glycol, and 2,2-bis (hydroxymethyl) propionic acid. It is preferable that the urethane-type polymer be a resin whose monomer include a component unit having an acidic group such as carboxylic acid and a hydroxyphenyl group in a molecule in an amount of 1 mol % or more.

Among these examples of alkaline soluble polymer compounds, novolak resins are preferable in terms of the durability of the form plate. On the other hand, polymers whose monomers include hydroxystyrene and acrylic copolymers having an alkaline-soluble group are preferable in terms of developing properties.

In the present invention, the amount of these alkaline soluble polymer compounds is 10 to 90% by weight, preferably 20 to 85% by weight, and more preferably 30 to 80% by weight based on the total solids of the radiation-sensitive patterning composition. If the amount of the alkaline soluble polymer compound is less than 10% by weight, the durability of the radiation-sensitive layer deteriorates. On the other hand, an amount more than 90% by weight is not preferable in terms of either sensitivity or durability.

These alkaline soluble polymer compounds can be used alone or in a combination of two or more.

While not wishing to be bound by theory, it is believed that the crosslinking and binder resins are co-reactive resins. The designations of "crosslinking resins" and "binder resin" may therefore be used interchangeably and, in some cases, one resin may act as both a "crosslinking resin" and as a "binder resin."

(D) Infrared Absorbing Compounds

Infrared ray absorbing compounds used in the present invention are a dye or pigment effectively absorbing an infrared ray having a wavelength of 760 nm to 1,200 nm. It is preferable that the dye or pigment have an absorption maximum between the wavelengths of 760 nm and 1,200 nm. Preferably, the IR dyes contain anions that do not form volatile acids in the presence of other strong acids.

As dyes, known dyes commercially available or those disclosed in the literature (such as "Senryo Binran (Dye Handbook)" edited by Yuki Gosei Kagaku Kyokai (Organic Synthetic Chemistry Association), published in 1970, can be used. Specifically, examples include azo dyes, metal complex azo dyes, pyrazolone azo dyes, anthraquinone dyes, phthalocyanine dyes, carbonium dyes, quinoneimine dyes, methyne dyes, cyanine dyes, and metal thiolate complexes.

Examples of preferable dyes include cyanine dyes disclosed in Japanese Patent Application Laid-Open (JP-A) Nos. 58-125246, 59-84356, 59-202829, and 60-78787; methyne dyes disclosed in Japanese Patent Application Laid-Open (JP-A) Nos. 58-173696, 58-181690, and 58-194595; naphthoquinone dyes disclosed in Japanese Patent Application Laid-Open (JP-A) Nos. 58-112793, 58-224793, 59-48187, 59-73996, 60-52940, and 60-63744; squarylium dyes disclosed in Japanese Patent Application Laid-Open (JP-A) No. 58-112792; and cyanine dyes disclosed in U.K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in Japanese Patent Application Laid-Open (JP-A) No. 57-142645 (U.S. Pat. No. 4,327,169); pyrylium-containing compounds disclosed in Japanese Patent Application Laid-Open (JP-A) Nos. 58-181051, 58-220143, 59-41363, 59-84248, 59-84249, 59-146063, and 146061; cyanine dyes disclosed in Japanese Patent Application Laid-Open (JP-A) No. 59-216146; pentamethyne thiopyrylium salts disclosed in U.S. Pat. No. 4,283,475; and pyrylium compounds disclosed in Japanese Patent Application Publication Nos. 5-13514 and 5-19702 can be preferably used as well.

As other examples of preferable dyes, near infrared absorption dyes disclosed U.S. Pat. No. 4,756,993 represented by formulas (I) and (II) therein may be preferred.

Among these dyes, particularly preferable are cyanine dyes, squarylium dyes, pyrylium salts, and nickel thiolate complexes.

Pigments usable in the present invention include commercially available pigments and those disclosed in the Color Index (C.I.) Manual, "Saishin Ganryo Binran (Modern Pigment Manual)" edited by Nippon Ganryo Gijutsu Kyokai (Japan Pigment Technology Association), published in 1977; "Ganryo Oyo Gijutsu (Modem Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, Paris Blue pigment, Prussian Blue pigment, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods include a method of surface coating with a resin or a wax, a method of adhering a surfactant, and a method of bonding a reactive substance (such as a silane coupling agent, an epoxy compound, and polyisocyanate) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modem Pigment Application Technology)" by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording layer.

As methods of dispersing a pigment, known dispersing methods employed in ink production or toner production can be used. Examples of dispersing machines include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modem Pigment Application Technology)" by CMC Press, published in 1986.

These dyes or pigments can be added in an amount of 0.01 to 50% by weight based on the total solids of the radiation-sensitive patterning material, preferably in an amount of 0.1 to 10% by weight, more preferably in an amount of 0.5 to 10% by weight in the case of a dye, and more preferably in an amount of 0.1 to 10% by weight in the case of a pigment. An amount of a pigment or dye less than 0.01% by weight causes low sensitivity. On the other hand, an amount more than 50% by weight produces stains in a nonimage portion at the time of printing.

These dyes or pigments can be added in a layer with other components or, in a case in which the image recording material comprises a plurality of layers, can be added in a layer which is different from a layer containing the other components.

Although infrared absorbers are generally required for most preferred applications, new developments with dynamic mirrors and ultraviolet lasers may allow for radiation-sensitive compositions of the present invention that do not require infrared absorbers, but only need the above-noted first three components. Accordingly, one embodiment of the present invention encompasses this alternative composition and its use with these new imaging techniques.

(E) Other Components

In the present invention, the above-mentioned four components (A) to (D) are necessary, and various compounds can be added to the radiation-sensitive patterning material as needed.

For example, a dye having a large absorption in the visible light region can be used as the coloring agent.

Preferably, these visible dyes and colorant agents contain anions that do not form volatile acids in the presence of other strong acids.

Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (C1145170B), Malachite Green (CI42000), Methylene Blue (CI52015), and dyes disclosed in Japanese Patent Application Laid-Open (JP-A) No. 62-293247.

It is preferable to add these dyes for easily distinguishing the image portion and the nonimage portion after image formation. The amount to be added is 0.01 to 10% by weight based on the total solid component of the patterning composition.

In order to enable stable treatment regardless of the fluctuation in development conditions, a nonionic surfactant disclosed in Japanese Patent Application Laid-Open (JP-A) Nos. 62-251740 and 3-208514 and an ampholytic surfactant disclosed in Japanese Patent Application Laid-Open (JP-A) Nos. 59-121044 and 4-13149 can be added to the patterning composition of the present invention.

Examples of nonionic surfactants include sorbitan tristearate, sorbitan monopalmitate, sorbitan triolate, mono glyceride stearate, and polyoxyethylene nonylphenyl ether.

Examples of ampholytic surfactants include alkyl di(aminoethyl)glycine, alkyl polyaminoethylglycine hydrochloride, 2-alkyl-n-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-mentioned nonionic surfactants and ampholytic surfactants is preferably 0.05 to 15% by weight, and more preferably 0.1 to 5% by weight in a radiation-sensitive patterning material.

In order to provide flexibility to the film, and the like, a plasticizer can be added as needed to the image recording material of the present invention. Examples of a plasticizer include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid.

In addition to these examples, the above-mentioned onium salts, haloalkylated s-triazines, epoxy compounds, vinyl ethers, phenol compounds having an alkoxy methyl group and phenol compounds having a hydroxymethyl group disclosed in Japanese Patent Application No. 7-18120, can also be added.

An image recording material of the present invention can be produced, in general, by dissolving the above-mentioned component in a solvent and applying the resultant solution to an appropriate support. Solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrolidone, dimethyl sulfoxide, sulfolane, gamma.-butyl lactone, toluene, acetone and water.

These solvents are used alone or as a mixture. The concentration of the above-mentioned components (total solid components including additives) is preferably 1 to 50% by weight in the solution. The application amount (solid component) on the support obtained after applying and drying is determined according to the application purpose. However, as to the planographic printing plate, in general, 0.5 to 5.0 g/m² is preferable and 1 to 2.5 g/m² is more preferable. As a method of application, various methods can be used, such as bar coater application, rotation application, spray application, curtain application, dip application, air knife application, blade application, and roll application. As the application amount decreases, the apparent sensitivity increases, but the film characteristic of the image recording film decreases.

A surfactant for improving the applicability, such as a fluorine-containing surfactant disclosed in Japanese Patent Application Laid-Open (JP-A) No. 62-170950 can be added to an image recording layer of the present invention. An addition amount is preferably 0.01 to 1% by weight based on the total solid component of the radiation-sensitive patterning composition, and more preferably 0.05 to 0.5% by weight.

II. Lithographic Substrates

Examples of a support used in the present invention include dimensionally stable plate-like substances such as paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-mentioned metals.

A polyester film or an aluminum plate is preferable as a support in the present invention. In particular, an aluminum plate is preferable since it has good dimensional stability and can be provided at a relatively low cost. Examples of preferable aluminum plates include pure aluminum plates and alloy plates comprising aluminum as the main component and trace quantities of a different element. Furthermore, plastic films to which aluminum is laminated or deposited can also be used. Examples of different elements included in an aluminum alloy include silicon, iron, manganese, copper, magnesium, chrome, zinc, bismuth, nickel, and titanium. An amount of the different element in the alloy is preferably 10% by weight or less. In the present invention, pure aluminum is particularly preferable. However, since production of a completely pure aluminum is difficult in terms of refining technology, one containing trace quantities of a different element can be used. The composition of an aluminum plate applied in the present invention as mentioned above is not specifically defined, and a known aluminum plate can be also used. The thickness of an aluminum plate used in the present invention is about 0.1 mm to 0.6 mm, preferably 0.15 mm to 0.4 mm, and more preferably 0.2 mm to 0.3 mm.

When an aluminum plate is used as the support, it is desirable to conduct a roughening treatment prior to the coating with a polymer first layer. Also, prior to roughening of the aluminum plate, a degreasing treatment with a surfactant, an organic solvent, or an aqueous alkaline solution is conducted for removing the rolling oil on the surface as needed.

The surface roughening treatment of an aluminum plate can be implemented using various methods, such as a mechanically roughening method, an electrochemically roughening method in which a plate surface is dissolved, and a chemically roughening method in which a plate surface is dissolved selectively. As a mechanical method, known methods such as a ball abrasion method, brush abrasion method, blast abrasion method, and buff abrasion method can be used. As an electrochemically roughening method, a method in which an alternating current or direct current is applied to a plate in an electrolytic solution containing a hydrochloric acid or nitric acid can be used. Further, a method combining both of the above-mentioned methods as disclosed in Japanese Patent Application Laid-Open (JP-A) No. 54-63902 can be used.

An aluminum plate to which surface roughening treatment is applied may be subjected to an alkaline etching treatment or a neutralizing treatment, if necessary, followed by an anodizing treatment so as to improve the water retention property and the abrasion resistance property of the surface, if desired. As an electrolyte used in the anodizing treatment of an aluminum plate, various electrolytes which form a porous oxide film can be used. In general, sulfuric acid, phosphoric acid, oxalic acid, chromic acid, or a mixture thereof can be used. The concentration of an electrolyte is suitably decided according to the type of electrolyte.

The treatment conditions of the anodization may not be specified since they significantly change depending on the type of electrotype solution used. In general, conditions of an electrolyte solution concentration of 1 to 80% by weight, a solution temperature of 5 to 70° C., a current density of 5 to 60 A/dm², a voltage of 1 to 100 V, and an electrolysis duration of 10 seconds to 5 minutes are appropriate.

If the amount of film produced by anodization, durability of the plate may be insufficient, less than 1.0 g/m², and scratches may be easily produced in a non-image portion of the planographic printing plate and, thereby, so-called "scratch toning" in which ink adheres to such scratches in printing.

After the anodizing treatment, hydrophilic treatment is applied to the aluminum surface, if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734, and 3,902,734. In this method, the support (aluminum plate) is treated by immersing or electrolysis with an aqueous solution of sodium silicate. Other examples include a method of treating with potassium fluorozirconate disclosed in Japanese Patent Application Publication (JP-B) No. 36-22063 and a method of treating with polyvinyl phosphonate disclosed in U.S. Pat. Nos. 3,276,868, 4,153,461, and 4,689,272.

III. Processes of Imaging

The patterning composition is coated onto the above-noted substrate by any known coating technique. Examples of such coating technology include rotation or spin coating, slot coating wire bar coating, dip coating, air knife coating, roll coating, blade coating, curtain coating and the like. The preferred method is slot coating.

The patterning composition is preferably dried to a suitable temperature to remove excess solvent. This drying may be carried out in a hot air drier or infrared ray dryer and the like, preferably at temperatures from about 40° C. to about 150° C. for 30 seconds to 10 minutes.

The thickness of the resulting layer, after drying, on the support can vary widely, but it is typically in the range from about 0.5 to about 3 microns, more preferably, from about 1 to about 2 microns.

No other essential layers are provided on the substrate. In particular, there need be no protective or other type of layers over the patterning composition layer. Optional, but not preferred, antihalation layers may be disposed under the imaging layer, or on the backside of the support (such as when the support is a transparent polymeric film).

The second step of the present process subjected the patterning composition layer to sufficient actinic radiation (e.g. 180 nm to 1200 nm) to imagewise expose that layer. The actinic radiation may be any radiation that will image this layer, including infrared (IR), ultra-violet and visible light. The sensitive material is preferably exposed to infrared radiation (IR) by scanning a laser beam modulated by an image signal. This IR imaging may be carried out by well-known methods. For example, the patterning composition layer may be imaged with a laser or an array of lasers emitting modulated near IR or IR radiation in a wavelength region that is absorbed by the absorber. IR radiation, especially IR radiation in the range of 750 to 1200 nm, preferably about 800 nm to about 1125 nm, is typically used for imaging thermally imageable elements. Imaging is conveniently carried out with a laser emitting at about 830 or at about 1056 nm. The IR exposure energy is preferably from about 30 to about 500 $mJ/cm^2$; more preferably from about 30 to about 350 $mJ/cm^2$, and most preferably from about 50 to about 175 $mJ/cm^2$. Suitable commercially available imaging devices include imagesetters such as the Creo Trendsetter (CREO, British Columbia, Canada), the Gerber Crescent 42T (GERBER, Brussels, Belgium) and Platerite 8000 (SCREEN, Rolling Meadows, Ill.). While IR exposure is the preferred actinic radiation source, conventional UV light or visible light sources may also be used. These include carbon arc lamps, mercury vapor lamps, fluorescent lamps, tungsten lamps and photoflood lamps operating in the UV/visible light spectrum between 250 and 700 nm.

Alternatively, the patterning composition layer may be imaged using an apparatus containing a heated stylus or a thermal printing heat. A suitable commercially hot stylus imaging device is the GS 618-400 thermal plotter (OYO Instruments, Houston, Tex.). When exposure is carried out with a thermal head, it is unnecessary that the element contains the IR absorber. However, elements that do can still be imaged with the thermal head.

After the imagewise radiation or exposure, the patterning composition may be optionally heated. This optional heating operation can be effected by radiation, convection, contact with heated surfaces, for example, with rollers, or by immersion in a heated bath comprising an inert liquid, for example, water. The temperature range will be set around the fog point of the plate containing the patterning composition. The fog point is defined as the minimum amount of heat energy required to render a thermal plate non-processable. Preferably, the applied heat energy is ±50° F. from the fog point, more preferably ±30° F. from the fog point and most preferably ±15° F. from the fog point. The duration of heating can vary widely, depending on the method chosen for the application of heat as well as the other steps in the process. If a heat-transferring medium is used, the heating time will preferably be from about 30 seconds to about 30 minutes, more preferably from about 1 minute to about 5 minutes.

The next step of the present process is developing the exposed patterned composition layer with an aqueous developing solution. The developing solution used for the development processing may be any liquid or solution that can penetrate and remove the unexposed regions without substantially affecting the complimentary exposed regions. While not being bound by any theory or explanation, it is believed that image discrimination is based on kinetic effect. The unexposed regions are removed more rapidly in the developer than the exposed regions. Development is carried for a long enough time to remove the unexposed regions in the developer, but not long enough to remove the exposed regions. The preferred time in the developer is from about 10 to 120 seconds. Hence the unexposed regions are described as being "soluble" or "removable" in the developer because they are removed, and dissolved and/or dispersed, more rapidly in the developer than the exposed regions.

A conventionally known aqueous alkaline solution can be used as a developer or a replenisher for an image recording material of the present invention. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Furthermore, also used are organic alkaline agents such as monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, and pyridine.

These alkaline agents can be used alone or in a combination of two or more.

Furthermore, it is known that, in a case in which an automatic developing machine is used for developing, by adding to the developer an aqueous solution (replenisher) whose alkaline is stronger than that of the developer, a large amount of planographic printing plates can be developed without changing the developer in the developing tank for a long time. The replenishing method is also preferably applied in the present invention.

Various types of surfactants and organic solvents can be added to a developer or a replenisher for promoting or curbing the developing property, improving the dispersion of developing scum or conformity of the printing plate image portion to ink as needed. Examples of preferable surfactants include anionic surfactants, cationic surfactants, nonionic surfactants, and ampholytic surfactants.

Furthermore, reducing agents such as a sodium salt or a potassium salt of an inorganic acid including hydroquinone, resorcin, sulfurous acid, and hydrogen sulfurous acid, organic carboxylic acid, antifoaming agents, and water softeners can be added to a developer or a replenisher as needed.

Useful developers are aqueous solutions having a pH of about 7 or above. Preferred aqueous alkaline developers are those that have a pH between 8 and about 13.5, typically at least about 11, preferably at least about 12. Useful developers include commercially available developers such as PC9000, PC3000, PC955, PC592, Goldstar™, Greenstar™, ThermalPro™, PROTHERM®, MX1710, and 956 aqueous alkaline developers, each available from Kodak Polychrome Graphics LLC, Developers are described for example in Yamasue, U.S. Pat. No. 4,259,434, Seino U.S. Pat. No. 4,452,880, Miller U.S. Pat. No. 5 851,735, Eckler U.S. Pat. No. 5,998,102, Miro US EP-A-0732628, Toyama, GB-A-2276729 and Fiebag U.S. Pat. No. 6,143,479.

Development is typically carried out in a processor equipped with an immersion type developing bath, a section for rinsing with water, a gumming section, a drying section and a conductivity measuring unit. Typically the developer is applied to the imaged precursor by rubbing or wiping the element with an applicator containing the developer. Alternatively, the imaged precursor may be brushed with the developer or the developer may be applied to the precursor by spraying the element with sufficient force to remove the unexposed regions. In either instance, a printing plate is produced. Development may be carried out in a commercially available processor, such as a Mercury V Processor and (available from Kodak Polychrome Graphics) and a Quartz K85 Processor (available from Glunz and Jensen of Norfolk, UK). Preferably, the developer temperature is from about 10° C. to about 50° C., more preferably about 15° C. to about 35° C. Following development, the printing plate is rinsed with water and dried. Drying may be conveniently carried out by IR heaters or with hot air. After drying, the printing plate may be treated with a gumming solution. A gumming solution comprises one or more water soluble polymers, for example polyvinylalcohol, polymethacrylic acid, polymethacrylamide, polyhydroxyethylmethacrylate, polyvinylmethacrylate, gelatin and polysaccharide such as dextrin, pullulan, cellulose, gum arabic and alginic acid. A preferred material is gum arabic.

While post-development heating or other operation is normally not necessary for this invention, such operations may be preferred for some applications.

The images obtained by the above described processing are suitable for many uses. For example, in the case of using a simple aluminum plate as the base, good prints are obtained by applying it to a printing machine after carrying out development. Further, a material prepared by providing a sensitive layer containing dyes on a transparent plastic film such as a polyester film can be used for correction of prints. In addition, it is possible to use photomasks, laser recording of output signals of computers and facsimile recording materials.

Moreover, the base of the developed sensitive material may be subjected to various processings according to the purpose. For example, in case of using a glass plate having a chromium vacuum deposition layer as the base, the chromium deposition layer is etched with a known etching solution containing ceric ion after the sensitive layer is developed to form a etching resist, and the resist layer is then removed, by which the base can be used as a hard mask. In case of using a silicon plate as the base, it is possible to make an etching resist of the silicon oxide layer or to use for a lift-off step. In case of using a copper foil plate for making a print circuit plate, it is possible to use as an etching resist or a plating resist after development.

The present invention is further described in detail by means of the following Examples and Comparisons. All parts and percentages are by weight and all temperatures are degrees Celsius unless explicitly stated otherwise.

EXAMPLES

Synthesis Example 1

Synthesis of 2-methoxy-4-(phenylamino)-benzenediazonium polystyrene sulfonate (MSPSS) acid generator.

0.50 g of sodium polystyrene sulfonate (Scientific Polymer Products, Inc., Ontario, N.Y.) in 50 ml of water was slowly mixed with 15 ml of 5% (wt %) 2-methoxy-4-(phenylamino)-benzenediazonium bisulfate (Diverstec, Fort Collins, Colo.) aqueous solution while stirring. The mixture was stored in dark at 0–5° C. for 5 hours. After decanting water, the resulting oil material was dried under nitrogen flow and the yield was 1.0 g. The product was then dissolved in 30 ml of γ-butyrolatone (BLO), and was stored in refrigerator for further use.

Proton NMR (in DMSO-$d_6$): δ 0.4–2.4 (4H, br), 4.0 (3H, s), 6.5–7.0 (4H, m, br), 7.2–7.8 (7H, m, br), 8.1 (1H, s), and 10.8 (1H, s).

Synthesis Example 2

Synthesis of 2-methoxy-4-phenylamino)-benzenediazonium sulfonated phenolic resin (MSFC-369) acid generator.

10 g of sodium sulfonated phenolic resin FC-369 (3M, St. Paul, Minn.) in 150 ml of water was slowly mixed with 25 ml of 5% (wt %) 2-methoxy-4-(phenylamino)-benzenediazonium bisulfate (Diverstec, Fort Collins, Colo.) aqueous solution while stirring. The reaction mixture was stored in dark at 0–5° C. for 5 hours. The yellow solid was collected by filtration and then dried by vacuum. The yield was 8.8 g.

Proton NMR in DMSO-$d_6$: δ 3.8 (2H, br), 4.0 (3H, s), 6.5–7.2 (5H, m), 7.2–8.2 (12H, m), 10.7 (1H, s) and 11.1 (1H, m).

Example 3

Preparations of the Lithographic Plates

A coating solution was prepared by dissolving 5.6 g of 25% resole (GP649D99 resole resin from Georgia-Pacific, Atlanta, Ga.), 6.8 g of 34% N-13 novolak (Eastman Kodak Company, Rochester, N.Y.), 23 g of MSPSS (3.5% in BLO) prepared above, 0.42 of 2-[2-[2-chloro-3-[2-(1,3-dihydro-1,3,3-trimethyl-2H-benzeindol-2-ylidene)ethylidene ]-1-cyclohexen-1-yl]ethenyl]-1,3,3-trimethyl-1H-benzeindolium 4-methylbenzenesulfonate (Eastman Kodak Company, Rochester, N.Y.), 0.06 g of D11 colorant dye (PCAS, Longjumeau, France), and 0.2 g of 10% Byk-307 (Byk-Chemie, Wallingford, Conn.) in 30 g of 1-methoxy-2-propanol and 25 g of BLO. An electrochemically grained and anodized aluminum substrate, post-treated with polyvinylphosphoric acid (PVPA), was coated with above solution with a dry coating weight of about 120 mg/ft$^2$. When properly dried at 190° F. for about 2 minutes on a rotating drum, the resulting plate was placed on a CREO® Trendsetter 3244x image setter (CreoScitex, Burnaby, British Columbia, Canada) and exposed to 830 nm infrared laser at a drum speed of 165 rpm and a series of laser power from 3 to 14 W (exposure energy from 40 to 180 mJ/cm$^2$). The minimum exposure energy to achieve maximum processed density was about 100 mJ/cm$^2$. The plate was preheated in a SPC Mlnl-HD Oven (Wisconsin Oven Corp., East Troy, Wis.) at 2630° F. for about 2 minutes and was subsequently developed through a Unigraph Quartz K85 processor (Glunz & Jensen, Norfolk, England) charged with ThermalPro™ developer (manufactured by Kodak Polychrome Graphics, Norwalk, Conn.) at 25° C. The developed plate was mounted on a Miehle sheet-fed press to produce about 20,000 good impressions using a black ink containing 1.5% of calcium carbonate.

The plate can alternatively be imaged by UV radiation. An UV exposure was accomplished by flood exposing the plate prepared above on an Olec Light Integrator (OLEC Corporation, Irvine, Calif.) with 25 units, and a six to ten sensitivity was achieved based on a T-4 grayscale.

Example 4

A coating solution was prepared by dissolving 6.8 g of 25% resole (GP649D99 resole resin from Georgia-Pacific), 8.4 g of 34% N-13 novolak (Eastman Kodak Company), 0.7 g of MSFC-369 prepared above, 0.5 of 2-[2-[2-chloro-3-[2-(1,3-dihydro-1,3,3-trimethyl-2H-benzeindol-2-ylidene)ethylidene]-1-cyclohexen-1-yl]ethenyl]-1,3,3-trimethyl-1H-benzeindolium 4-methylbenzenesulfonate (Eastman Kodak Company), 0.4 g of terephthaldicarboxaldehyde (Aldrich), 0.1 g of D11 colorant dye (PCAS, Longjumeau, France), and 0.2 g of 10% Byk-307 (Byk Chemie) in 64 g of 1-methoxy-2-propanol and 20 g of BLO. An electrochemically grained and anodized aluminum substrate was coated with above solution with a dry coating weight of about 130 mg/ft$^2$. The plates were imaged as described in Example 3. The minimum exposure energy to achieve maximum image density was about 120 mJ/cm$^2$. The plate can alternatively be imaged by ultraviolet radiation.

When Example 3 to 4 are conducted with ultraviolet imaging, the infrared dye employed therein is non-critical.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A radiation-sensitive patterning composition comprising:
   (1) at least one acid generating compound selected from the group consisting of compounds of formula (I) and compound of formula (II):

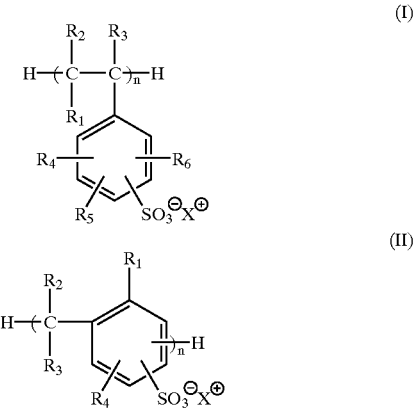

wherein:
   $R_1$, $R_2$, $R_3$, R4, $R_5$, and $R_6$, are each individually selected from the group consisting of hydrogen, nitro, hydroxyl, halogen, cyano, unsubstituted alkyl, substituted alkyl, unsubstituted cyanoalkyl, substituted cycloalkyl, unsubstituted alkoxy, substituted alkoxy, unsubstituted aryl,-and substituted aryl;
   X+ is an onium ion selected from the group consisting of diazonium, iodonium, sulfonium, phosphonium, bromonium, oxysulfoxonium, oxysulfonium, and sulfoxonium; and
   n is an integer from 4 to 100;
   (2) at least one cross-linking agent cross-linkable by an acid;
   (3) at least one polymer compound capable of reacting with the cross-linking agent; and
   (4) at least one infrared absorbing compound.

2. The radiation-sensitive patterning composition of claim 1 wherein $R_1$, $R_2$, $R_3$, $R_4$, $R_5$, and $R_6$ are each individually selected from the group consisting of hydrogen, hydroxyl, unsubstituted alkyl groups having 1 to 20 carbon atoms, and substituted alkyl groups having 1 to 20 carbon atoms.

3. The radiation-sensitive patterning composition of claim 2 wherein X$^+$ is diazonium.

4. The radiation-sensitive patterning composition of claim 1 wherein X$^+$ is selected from the group consisting of diazonium, iodonium, and sulfonium.

5. The radiation-sensitive patterning composition of claim 1 wherein X$^+$ is 2-methoxy-4-(phenylamino)- benzenediazonium.

6. The radiation-sensitive patterning composition of claim 1 wherein the cross-linking agent is a terephthaldicarboxyaldehyde.

7. The radiation-sensitive patterning composition of claim 1 wherein the polymer compound is a polymer compound having an alkaline-soluble group.

8. A radiation-sensitive imaging element comprising a lithographic substrate having a coating of the radiation-sensitive composition of claim 1 thereon.

9. The imaging element of claim 8 wherein the lithographic substrate is an aluminum plate.

10. The imaging element of claim 9 wherein the aluminum plate is anodized before the patterning composition is coated thereon.

11. The radiation-sensitive patterning composition of claim 1 wherein the acid generating compound is 2-methoxy-4-(phenylamino)-benzenediazonium polystyrene sulfonate.

12. The radiation-sensitive patterning composition of claim 11 wherein the cross-linking agent is a resole resin and the polymer compound capable of reacting with the cross-linking agent is a novolak resin.

13. The radiation-sensitive patterning composition of claim 1 wherein the acid generating compound is a 2-methoxy-4-(phenylamino)-benzenediazonium sulfonated phenolic resin.

14. The radiation-sensitive patterning composition of claim 13 wherein the cross-linking agent is a resole resin and the polymer compound capable of reacting with the cross-linking agent is a novolak resin.

15. The radiation-sensitive patterning composition of claim 1 wherein:
   $R_1$, $R_2$, $R_3$, $R_4$, $R_5$, and $R_6$ are each individually hydrogen or methyl and
   X$^+$ is selected from the group consisting of diazonium, iodonium, and sulfonium.

16. The radiation-sensitive patterning composition of claim 15 wherein the cross-linking agent is a resole resin and the polymer compound capable of reacting with the cross-linking agent is a novolak resin.

17. The radiation-sensitive patterning composition of claim 15 wherein the cross-linking agent is a phenol derivative having (1) at least two groups bonded to a benzene ring, the groups selected from the group consisting of hydroxymethyl groups and alkoxymethyl groups, (2) 3 to 5 benzene rings, and (3) a molecular weight of 1,200 or less.

18. The radiation-sensitive patterning composition of claim 1 wherein:
   the acid generating compound comprises about 0.01% to about 50% by weight of the solid components of the radiation-sensitive composition;
   the cross-linking agent comprises about 5% to 70% by weight of the solid components of the radiation-sensitive composition;

the polymer compound comprises about 10% to about 90% by weight of the solid components of the radiation-sensitive composition; and the infrared absorbing agent comprises about 0.01% to about 50% by weight of the solid components of the radiation-sensitive composition.

19. The radiation-sensitive patterning composition of claim 18 wherein:

the acid generating compound is selected from compounds of the-formula (I);

$R_1$, $R_2$, $R_3$, $R_4$, $R_5$, and $R_6$ are each hydrogen;

$X^+$ is 2-methoxy-4-(phenylamino)-benzenediazonium; and n is from 4 to 20.

20. The radiation-sensitive patterning composition of claim 18 wherein:

the acid generating compound is selected from compounds of the formula (II):

$R_1$ is hydroxyl;

$X^+$ is 2-methoxy-4-(phenylamino)-benzenediazonium; and n is from 4 to 20.

21. A process of imaging a radiation-sensitive imaging element, the process comprising the steps of:

(1) providing the radiation-sensitive imaging element, the radiation-sensitive imaging element comprising a lithographic substrate having a layer of the radiation-sensitive patterning composition of claim 1 thereon;

(2) imagewise exposing the radiation-sensitive imaging element and producing an imaged imaging element comprising exposed and unexposed regions in the layer of radiation-sensitive patterning composition; and (3) removing the unexposed regions of the layer of radiation-sensitive patterning composition from the lithographic substrate with a developer, and leaving an image.

22. The process of claim 21 additionally comprising a step after step (2) and before step (3) of baking the imaged imaging element.

23. The process of claim 21 wherein:

$R_1$, $R_2$, $R_3$, $R_4$, $R_5$, and $R_6$ are each individually hydrogen or methyl; and $X^+$ is selected from the group consisting of diazonium, iodonium, and sulfonium.

24. The process of claim 23 wherein step (2) is carried out with infrared radiation.

25. The process of claim 24 wherein:

the acid generating compound is a 2-methoxy-4-(phenylamino)-benzenediazonium sulfonated phenolic resin;

the cross-linking agent is a resole resin; and the polymer compound capable of reacting with the cross-linking agent is a novolak resin.

26. The process of claim 25 wherein:

the acid generating compound comprises about 0.01% to about 50% by weight of the solid components of the radiation-sensitive composition;

the cross-linking agent comprises about 5% to 70% by weight of the solid components of the radiation-sensitive composition;

the polymer compound comprises about 10% to about 90% by weight of the solid components of the radiation-sensitive composition; and the infrared absorbing agent comprises about 0.01% to about 50% by weight of the solid components of the radiation-sensitive composition.

27. The process of claim 23 wherein step (2) is carried out with ultraviolet radiation.

28. The process of claim 27 wherein:

the acid generating compound is a 2-methoxy-4-(phenylamino)-benzenediazonium sulfonated phenolic resin;

the cross-linking agent is a resole resin; and the polymer compound capable of reacting with the cross-linking agent is a novolak resin.

29. The process of claim 28 wherein:

the acid generating compound comprises about 0.01% to about 50% by weight of the solid components of the radiation-sensitive composition;

the cross-linking agent comprises about 5% to 70% by weight of the solid components of the radiation-sensitive composition;

the polymer compound comprises about 10% to about 90% by weight of the solid components of the radiation-sensitive composition; and the infrared absorbing agent comprises about 0.01% to about 50% by weight of the solid components of the radiation-sensitive composition.

30. The process of claim 23 in which $X^+$ is diazonium;

the cross-linking agent is a resole resin; and the polymer compound capable of reacting with the cross-linking agent is a novolak resin.

31. The process of claim 30 wherein step (2) is carried out with infrared radiation.

32. The process of claim 23 wherein step (2) is carried out with ultraviolet radiation.

* * * * *